United States Patent [19]
Kesner

[11] Patent Number: 5,659,268
[45] Date of Patent: Aug. 19, 1997

[54] DUAL FLIP-FLOP DETECTOR TYPE PHASE LOCKED LOOP INCORPORATING STATIC PHASE OFFSET CORRECTION

[75] Inventor: Donald R. Kesner, Phoenix, Ariz.

[73] Assignee: Bull HN Information Systems Inc., Billerica, Mass.

[21] Appl. No.: 625,663

[22] Filed: Mar. 29, 1996

[51] Int. Cl.$^6$ .................................................. H03L 7/093
[52] U.S. Cl. ........................... 331/1 A; 331/17; 331/25; 331/27
[58] Field of Search ........................ 331/17, 25, 1 A, 331/27

[56] References Cited

U.S. PATENT DOCUMENTS 4,599,570  7/1986  Cloke .............................. 327/7

*Primary Examiner*—Siegfried H. Grimm
*Attorney, Agent, or Firm*—J. S. Solakian; J. H. Phillips

[57] ABSTRACT

Compensation circuits are disclosed for correcting phase offset during apparent phase lock of a dual flip-flop phase detector type of phase locked loop. The phase offset is due to circuit delays in the phase detector which result in the issuance of simultaneous "pump up" and "pump down" signals, present even during apparent phase lock. A second pair of flip-flops (or a single flip-flop) of the same type used in the phase detector is sampled to obtain a compensating signal which is applied to the reference input of a differential amplifier in the loop filter. Each of the second pair of flip-flops is forced to assume a permanent state (for example, set) such that their respective Q and Q-bar outputs are always representative of the logic voltage levels at the corresponding outputs of the flip-flops in the phase detector from which the "pump up" and "pump down" are sourced. These voltages are summed to obtain a voltage exactly at the midpoint between logic "1" and logic "0", and this summed voltage is employed as the reference signal to the differential amplifier, thereby exactly counteracting any offset component of the voltage appearing at the signal input to the amplifier which is developed during normal operation of the phase detector, filter and summing circuit of the phase locked loop at apparent phase lock.

10 Claims, 4 Drawing Sheets

DUAL FLIP-FLOP DETECTOR TYPE PHASE LOCKED LOOP INCORPORATING STATIC PHASE OFFSET CORRECTION

FIELD OF THE INVENTION

This invention relates to the art of phase locked loops and, more particularly, to an improvement which corrects an out-of-phase lock condition when a dual flip-flop type phase detector is employed and the phase locked loop is operated in a relatively high frequency range.

BACKGROUND OF THE INVENTION

In the well known type of phase locked loop which employs a dual flip-flop phase detector, the two flip-flops are respectively clocked by a reference frequency signal and signal from a local oscillator frequency which tracks the reference frequency. A feedback gate is connected to nominally simultaneously change the flip-flops back to their previous state after they have both been clocked during a given cycle of operation. For example, if the flip-flops are connected to assume the set state when they are clocked, the feedback gate resets them both as soon as both are set. Thus, if one of the input signals leads the other in phase, the flip-flop it clocks sets earlier than the other flip-flop, but they both are subsequently reset at the same time. (Ideally, the second flip-flop is reset instantaneously after it is set.) Therefore, an output pulse representing the period that the first-to-set flip-flop remains set can be interpreted by downstream circuitry, which includes a differential amplifier, to develop a correction signal to pull the local oscillator in the appropriate direction to seek phase lock. The dual flip-flop phase detector type of phase locked loop is very reliable in operation for applications in which circuit delay through the flip-flops and feedback gate can be ignored for the contemplated frequency range of operation.

However, for critical applications at higher frequencies, a subtle error, always present, becomes meaningful. The manifestation of this error is that, when the phase locked loop is in apparent phase lock, it is, instead operating with the two frequency signals at the same frequency, but offset in phase. The cause of this subtle error is that, as a practical matter, there is a certain amount of delay through the flip-flops and feedback gate circuitry such that, under conditions of apparent phase lock, there are simultaneous "pump up" and "pump down" pulses of a width which cannot always be assumed to be infinitesimally narrow. While it might be thought that these pulses would merely cancel out, it has been found that such is not the case for critical applications because of inherent differences between the two sides ("pump up" and "pump down") of the phase detector circuitry. Usually the dominant imbalance is that the voltage midpoint between the respective active levels for the "pump up" and "pump down" pulses (logic "1" for one and logic "0" for the other) is not the same as the threshold midpoint at the error input to the amplifier component of the phase locked loop. The result is the aforementioned phase offset between the reference and the local frequency signals at apparent phase lock.

While this error is always present in the dual flip-flop phase detector type of phase locked loop, it is only when the duty cycles of the simultaneous "pump up" and "pump down" pulses become a significant portion of the total cycle time that it must be taken into account, and the critical point must be determined for each application because of such variables as the amount of phase offset which can be accommodated and the family of logic employed. The present invention serves to correct the error in all cases.

OBJECTS OF THE INVENTION

It is therefore a broad object of this invention to provide an improved phase locked loop of the type employing a dual flip-flop type of phase detector.

It is a more specific object of this invention to provide such an improved phase locked loop in which a phase error at apparent phase lock due to circuit delays in the phase detector is corrected.

In another aspect, it is a specific object of this invention to provide such an improved phase locked loop in which the phase error is corrected by simple, reliable and inexpensive compensation circuitry.

SUMMARY OF THE INVENTION

Briefly, these and other objects of the invention are achieved by using a second pair of flip-flops of the same type as used in the phase discriminator to statically obtain a compensating signal which is applied to the reference input of the amplifier component, typically a differential amplifier, of the phase locked loop. Each of the second pair of flip-flops is forced to assume a permanent state (for example, set) such that their respective Q and Q-bar outputs are representative of the logic voltage levels at the corresponding outputs of the flip-flops in the phase detector from which the "pump up" and "pump down" signals are sourced. Thus, these voltages can be summed to obtain a voltage exactly at the midpoint between logic "1" and logic "0", and this summed voltage may be employed as the reference signal to the differential amplifier, thereby exactly counteracting the offset component of the voltage appearing at the signal input to the amplifier which is developed during normal operation of the phase detector, filter and summing circuit at apparent phase lock. In one embodiment of the invention, a second differential amplifier is interposed between the summing point of the compensating samples and the reference input to the differential amplifier that issues the correction signal to the local oscillator in order to obtain isolation for the compensating circuit. In another embodiment, only a single auxiliary flip-flop is used as the source for the logic "1" and logic "0" voltage levels which are summed to obtain the reference, compensating voltage.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

DESCRIPTION OF THE PREFERRED EMBODIMENTS

Figure 1:
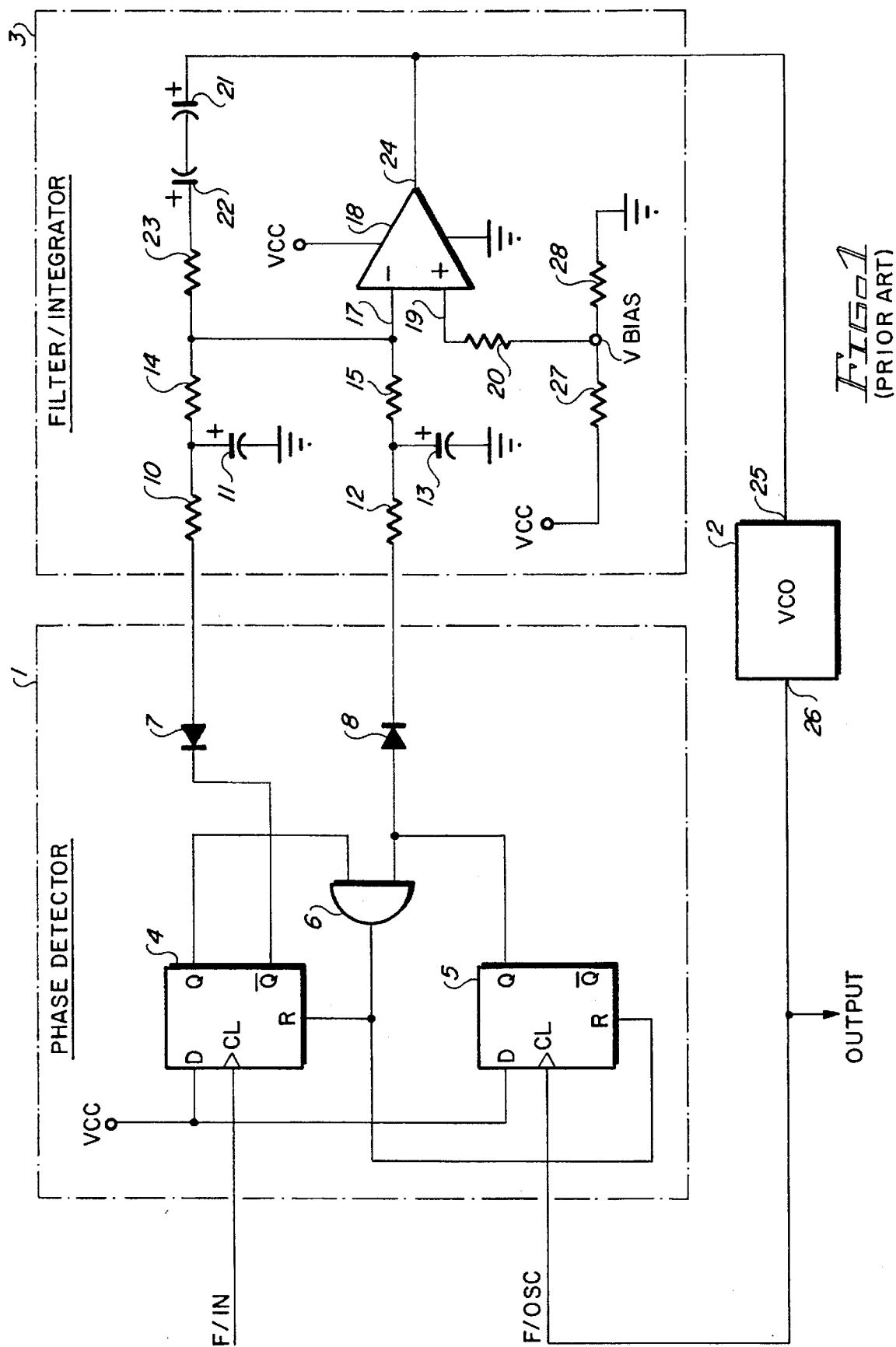
FIG. 1 shows a typical, prior art phase locked loop of the type that employs a dual flip-flop phase detector.

Referring now to FIG. 1, there is shown a typical, prior art phase locked loop of the type that employs a dual flip-flop phase detector. In accordance with all phase locked loops, the principal circuit blocks are a phase detector 1, a voltage controlled oscillator (VCO) 2 and a filter/integrator 3. The phase detector 1 receives both an external reference frequency signal F/IN and an internal signal F/OSC fed back from the VCO 2, the phase locked loop serving to force F/OSC, which may be used to control other circuitry (not shown), into frequency and phase lock with the reference signal F/IN. The instantaneous frequency of the VCO 2 output is governed by a voltage signal derived in the filter/integrator 3 from information received from the phase detector 1, all as well known in the art.

In the exemplary dual flip-flop type of phase detector shown in FIG. 1, a first D-type flip-flop 4, a second D-type flip-flop 5 and an AND-gate 6 are interconnected to obtain the signals sent to the filter/integrator 3. The data inputs of each of the flip-flops 4, 5 are connected directly to $V_{CC}$ such that each positive going transition at each clock input sets the corresponding flip-flop to obtain a logic "1" signal at its Q output and a logic "0" signal at its Q-bar output. An AND-gate 6 is driven from the Q outputs of the two flip-flops 4, 5 and will thus be fully enabled and issue a "clear" signal when both flip-flops are set. AND-gate 6 drives reset inputs, which are sensitive to the positive going transition of the "clear" signal, to each of the flip-flops 4, 5.

A first diode 7 is connected to the Q-bar output of flip-flop 4 in a polarity that can pass current only when the Q-bar output is at the logic "0" level; i.e., when the flip-flop 4 is set. A second diode 8 is connected to the Q output of flip-flop 5 in a polarity that can pass current only when the Q output is at the logic "1" level; i.e., also when the flip-flop 5 is set.

In operation, the phase detector senses any phase difference between F/IN and F/OSC by taking advantage of the fact that, although the flip-flops 4, 5 are reset at the same time by the output of the AND-gate 6, they are subject to being set independently by F/IN and F/OSC. Thus, under conditions in which there is not yet phase lock, one or the other of the flip-flops 4, 5 will be set for a longer period. (In fact, as will be discussed further below, one of the flip-flops will "ideally" be set for a period of "zero" length.) Consequently, current will pass through the corresponding diode 7, 8 for a longer period than through the other. By way of example, if F/OSC is slightly ahead of F/IN, the flip-flop 5 will be set before the flip-flop 4, and current will flow through diode 8 for a longer period than it does through diode 7. (As previously noted, ideally, there would be no current flow at all through the diode 7 in this example.)

The downstream filter/integrator is sensitive to these potential differences in current flow periods through the diodes 7, 8. The anode of diode 7 is connected to one end of a resistor 10 which has its other end connected to one plate of a capacitor 11 which, in ram, has its other plate connected to ground. Conversely, the cathode of diode 8 is connected to one end of a resistor 12 which has its other end connected to one plate of a capacitor 13 which has its other plate connected to ground. It will be seen that the resistor 10/capacitor 11 combination effects a low pass filter which serves to store a voltage intermediate logic "1" and logic "0" representing the recent average current passing through the diode 7. Similarly, the resistor 12/capacitor 13 combination effects a low pass filter which serves to store a voltage intermediate logic "1" and logic "0" representing the recent average current passing through the diode 8.

The voltages stored across each of the capacitors 11, 13 are coupled, through respective summing resistors 14, 15, to a summing or averaging point 16 which is connected to the negative input 17 of a differential control amplifier 18. The positive input 19 to the differential amplifier 18 is coupled, through isolation resistor 20, to a constant positive voltage reference, $V_{BIAS}$, established at the junction of matched resistors 27, 28 which are connected between $V_{CC}$ and ground potential. In this example, $V_{BIAS}$ is therefore set to the midpoint between $V_{CC}$ and ground potential. Optionally, a unity gain differential amplifier (not shown) may be conventionally interposed between the junction of the resistors 27, 28 and the resistor 20 to remove any substantive load from the reference voltage source and thus permit a wider choice for obtaining the reference voltage.

A feedback loop including series connected, back-to-back oriented capacitors 21, 22 (thus effecting a smaller, non-polarized capacitor) and 18 resistor 23 is provided between the output 24 of the differential amplifier 18 and the summing point 16. The output 24 of the differential amplifier 18 is also connected to the control input 25 to the VCO 2. It will therefore be understood that the instantaneous frequency of the output 26 from the VCO 2 is directly dependent on the instantaneous voltage at its input 25. As previously mentioned, the output from the VCO 2 may be employed to control other circuitry (not shown, the application being represented by the legend "OUTPUT") and is also fed back, as F/OSC, to the clock input to the flip-flop 5.

Consider first a steady state condition in which F/IN and F/OSC are the same frequency and in phase; i.e., phase lock has already been achieved. Assuming identical circuit responses and uniform delay through the various components, flip-flops 4, 5 will be set simultaneously and, a very short time later (due to delay in the flip-flop circuitry), AND-gate 6 will be fully enabled. After another brief delay due to the AND-gate circuitry, the output of AND-gate 6 will apply a reset signal to each of the flip-flops 4, 5. After yet another brief delay due to the flip-flop reset circuitry, flip-flops 4, 5 will simultaneously reset. Consequently, equal, but opposite logic levels, very short "bursts" of voltage will be applied to the cathode and anode, s respectively, of diodes 7, 8. Restated, these "pump down", (logic "0") and "pump up" (logic "1") signals are substantially identical in pulse width and therefore replenish the charges on capacitors 11, 13, respectively, equally; i.e. to the respective voltage levels reached during the preceding cycle of operation. Thus, the voltage stored across the capacitor 11 is nearer to logic "0" whereas the voltage stored across the capacitor 13 is nearer to logic "1".

Therefore, the voltage appearing at summing point 16 remains the same (a value exactly midway between, or the average of, the respective positive voltages stored across capacitors 11, 13) such that the output voltage from the differential amplifier 18 will remain at the value which will maintain the VCO 2 at the same instantaneous frequency. (This analysis assumes no leakage, deliberate or unintended, across the capacitors 11, 13 and that the input impedances to the differential amplifier 18 are high. If, in fact, there is a small amount of leakage around one or the other or both capacitors 11, 13 and taking into account the small drain through the input 17 of the differential amplifier 18, just enough additional, compensating current will flow through one or both the diodes 7, 8 to make up the loss each cycle.)

As soon as the very brief, simultaneous "pump down" and "pump up" signals are removed, the capacitors 11, 13 will be free to try to slowly "balance" (assume the same voltage) such that there will be a small amount of current flow through the summing resistors 14, 15 from the capacitor 13 to the capacitor 11 as well as a small amount into the negative input 17 of the differential amplifier 18. However, the voltage at the summing point 16 will remain the same, and the charges on the capacitors 11, 13 will be replenished by the next successive pumping period. As a practical matter, the resistances of summing resistors 14, 15 are much larger than resistors 10, 12 such that the voltages appearing across the capacitors 11, 13 only very slightly tend to change toward the summing point value from cycle to cycle under phase lock conditions, and any change is made up each cycle. Thus, this effect is usually ignored in an analysis of the operation of a dual flip-flop phase detector type of phase locked loop.

Now, consider a subsequent condition in which one of the frequency inputs changes phase, for example, when a frequency shift (intended or unintended) is taking place. Assume, merely by way of example, that the frequency of F/IN has slightly increased. As a result, the flip-flop 4 will be set slightly in advance of the flip-flop 5, and they will both be reset simultaneously as previously described. Therefore, for the present cycle of operation, the "burst" of logic "0" voltage applied through diode 7 will last longer than the "burst" of logic "1" voltage applied through the diode 8. The capacitor 11 will thus have a chance to discharge ("pump down") to a lower positive voltage than during the previous cycle while the capacitor 13 will "pump up" to substantially the same positive voltage. The result is that the voltage appearing at the summing point 16 will move slightly lower from its previous value. This will cause the voltage appearing at the output 24 of the differential amplifier 18 and the input 25 of the VCO 2 to change in the direction which will cause the VCO to increase the frequency of its output 26. Over a period of some number of cycles, the frequency/phase of the output 26 from the VCO 2 (F/OSC) will "catch up" and lock to the new frequency/phase of F/IN. Thereafter, until another change occurs in the frequency/phase of F/IN or F/OSC, the brief, simultaneous "pump down" and "pump up" currents will be equal to maintain the new average voltage values established across the capacitors 11, 13, and, correspondingly, the new, lower positive, voltage at the summing point 16, thus maintaining phase lock between the F/IN and F/OSC at the new, higher, frequency.

It is usually not desirable to try to fully "correct" the output frequency of the VCO 2 immediately because instability may result. The feedback loop comprising the capacitors 21, 22 and resistor 23 between the output 24 of the differential amplifier 18 and the summing point 16 serves to "soften" the effect of the changes in respective voltage levels across the capacitors 11, 13 to limit the rate of change to a safe level. That is, the feedback loop is phased to add a component to the voltage appearing at the summing point 16 which partially counteracts any change resulting from the summation of the voltages across the capacitors 11, 13 due to a sensed phase error. As a result, relock safely takes place over some number of cycles.

Those skilled in the art will understand that the foregoing is not quite the "ideal" usually employed in explaining the operation of the dual flip-flop phase detector form of the classical phase locked loop. In the ideal phase locked case in which circuit delay is ignored, the diodes 7, 8 are assumed to be perfect, the capacitors 11, 13 are assumed to have no leakage whatever, the summing resistors 14, 15 are assumed to be perfectly matched and the inputs 17, 19 to the differential amplifier 18 are assumed to have infinite impedance, there will be no (i.e., infinitely narrow) "pump up" and "pump down" pulses (the AND-gate 6 being "instantaneously" enabled and the flip-flops 4, 5 being "instantaneously" reset), and capacitor 13 will slowly discharge through summing resistors 14, 15 to capacitor 11 (as well as into the negative input 17 of the differential amplifier 18), thus maintaining the established voltage at the summing point 16 and thus the control voltage to the VCO 2 which results in phase lock. Theoretically, this current flow between the capacitors 11, 13 will continue until the capacitors eventually each store the voltage seen at the summing point 16. As a practical matter, even considering the brief, simultaneous "pump up" and "pump down" pulses which actually appear during phase lock as well as the existence of a brief pump pulse opposite to the substantive appropriate correcting pump pulse when out of lock, the circuit works substantially as described above and in a very satisfactory manner for relatively low frequency operation.

However, a subtle problem, which is always present, becomes substantive when the frequency of operation (as governed by F/IN), is raised beyond a certain level which is a factor of just how much delay takes place in the flip-flops 4, 5 and the AND-gate 6 during nominally normal operation under the condition in which phase lock has apparently been achieved. This delay, which gives rise to the subtle problem, is variable according to the family of integrated circuit implemented and variations in the manufacturing process, etc., of even apparently identical integrated circuit chips. The delay may also change slightly as a result of temperature changes, $V_{CC}$ changes, etc., experienced by the integrated circuit in use. Generally, it may be stated that the problem becomes significant when the frequency of F/IN is sufficiently high that the circuit delay through the flip-flops and reset gate (flip-flops 4, 5 and AND-gate 6 in the example) result in a significant period for the extraneous simultaneous "pump up" and "pump down" pulses being issued from the phase detector 1 when the phase locked loop is in apparent phase lock.

Because these extraneous simultaneous "pump up" and "pump down" pulses should theoretically have exactly equal amplitudes and time periods, it might be thought that they would merely cancel one another out. But, this presumes that the summing point (the summing point 16 in the example) in the circuit driven by the phase detector 1 has a threshold that is exactly half way between the two pulses as established at the reference input 19 to the differential amplifier 18. In a practical circuit, that is not the case, and it is this fact, together with the unavoidable existence of the extraneous simultaneous "pump up" and "pump down" pulses, which introduces a phase error at apparent phase lock which can become unacceptably large for critical applications at higher frequencies; i.e., as stated above, at frequencies which result in a significant period for the extraneous simultaneous "pump up" and "pump down" pulses being issued from the phase detector 1 as a consequence of the unavoidable, fixed delay through the phase detector circuitry.

To the extent reasonably possible, diodes 7, 8; resistors 10, 12; capacitors 11, 13; and summing resistors 14, 15 are closely matched in order to minimize any phase offset between the two inputs to the phase detector 1 at apparent phase lock due to mismatch of these components. As a practical matter, it is possible to achieve a sufficiently close match of these components, by selection and/or summing as well known in the art, that any residual imbalance of the voltage observed at the summing point 16 due to mismatch of these components may be ignored, even for critical applications.

However, several variables in the phase detector circuitry may contribute, each alone or in combination with one or more other variables, to bring about the phase lock offset problem to which the present invention is directed. Still referring to FIG. 1, the set circuit delays in the flip-flops 4, 5 may be slightly different. Similarly, the reset circuit delays through the two flip-flops may be slightly different. The differences between the logic "1" and logic "0" voltage levels appearing at the Q and Q-bar outputs of the flip-flops 4, 5 may be slightly different and may vary differently from $V_{CC}$ and circuit ground. The circuitry of the AND-gate 6 may be faster between one input and the output than the other input. The forward threshold voltages across the diodes 7, 8 and/or reverse resistances may be slightly different, etc.

As a first simple example of the effects of these possible differences, assume that, while all other differences between variables are minimal, the delay through the set circuitry of the flip-flop 4 is slightly greater than that through the set circuitry of the flip-flop 5. Assume further an instantaneous condition in which F/N and F/OSC are perfectly in phase such that the flip-flops 4, 5 should set simultaneously, but, in fact, the flip-flop 4 sets slightly behind the flip-flop 5 because of the assumed slight mismatch.

Under these conditions, the extraneous simultaneous "pump up" and "pump down" pulses issued from the phase detector 1 will have slightly different widths/periods. More particularly, the width of the pulse applied by the flip-flop to "pump up" the capacitor 13 will transfer slightly more energy to the capacitor 13 than the flip-flop 4 removes from the capacitor 11 because, while the flip-flops 4, 5 are reset simultaneously, the flip-flop 5 sets first. Consequently, the voltage across the capacitor 13 will move slightly more positive and the voltage at the summing point 16 will also become more positive. This results in a change of the output voltage from the differential amplifier 18 which tends to slightly lower the output frequency from the VCO 2. Thus, during the next cycle of operation, F/OSC will slightly lag F/N such that the clock signal to set the flip-flop 4 arrives slightly in advance of the clock signal to set the flip-flop 5. After a few cycles of operation, a stable point will be reached at which the signals F/N and F/OSC are identical in frequency and the pulse widths of the extraneous simultaneous "pump up" and "pump down" pulses are identical, but F/OSC trails F/N in phase to compensate for the imbalance resulting from the differences in the set circuit delays between the flip-flops 4, 5. Other examples, assuming imbalance in one or more of the other variables previously noted between the two sides of the phase detector circuitry, demonstrate similar results.

Experience and analysis has demonstrated that the exemplary source of imbalance discussed immediately above, i.e., delay differences through the set inputs to the two flip-flops 4, 5 (or other circuit delay differences), is not as important a factor as might at first be thought because if, for example as above, one of the flip-flops is slower to set, it will typically also be slower, by about the same amount, to reset such that little actual difference in the pulse widths of the extraneous simultaneous "pump down" and "pump up" pulses at instantaneous phase lock is observed. The same observation applies to the other variables which theoretically might result in different pulse widths for the simultaneous "pump up" and "pump down" pulses issued by the phase detector at apparent phase lock.

However, the same cannot be said for the voltage differences which might exist between logic "1" and logic "0" voltage levels at the Q and Q-bar outputs of the two flip-flops 4, 5 compared to $V_{CC}$ and ground. That is, if the midpoint between logic "1" and logic "0" voltages at the Q-bar output of the flip-flop 4 and the Q output of the flip-flop 5, respectively, is found to be sufficiently different from the midpoint between $V_{CC}$ and ground, then there is no compensating effect, and the error cannot be ignored if the phase locked loop is operating at frequencies at which the circuit delays in the flip-flops 4, 5 and the AND-gate 6 result in extraneous simultaneous "pump up" and "pump down" pulses of substantial width (i.e., a substantial portion of the duty cycle) during instantaneous phase lock. A substantive error results even if these pulses are nominally the same width.

For example, if the midpoint between logic "0" at the Q output of the flip-flop 5 and logic "1" at the Q-bar output of the flip-flop 4 is more positive than that between $V_{CC}$ and ground, then, for equal width extraneous simultaneous "pump up" and "pump down" pulses issued under actual phase lock conditions, the voltage appearing at the summing point 16 will become slightly more positive than the correct voltage for maintaining phase lock as established by the reference voltage, $V_{BIAS}$, applied to the positive input 19 of the differential amplifier 18. As a result, the voltage appearing at the output 24 of the differential amplifier will be such as to momentarily slightly decrease the frequency of the VCO to retard the next set condition of the flip-flop 5 behind that of the flip-flop 4. Under these conditions, a stable condition will quickly be reached in which F/N and F/OSC are identical in frequency, but F/OSC lags F/N in phase. The stable voltage then present at the summing point 16 is an incorrect indication that true phase lock has been achieved.

Figure 2:
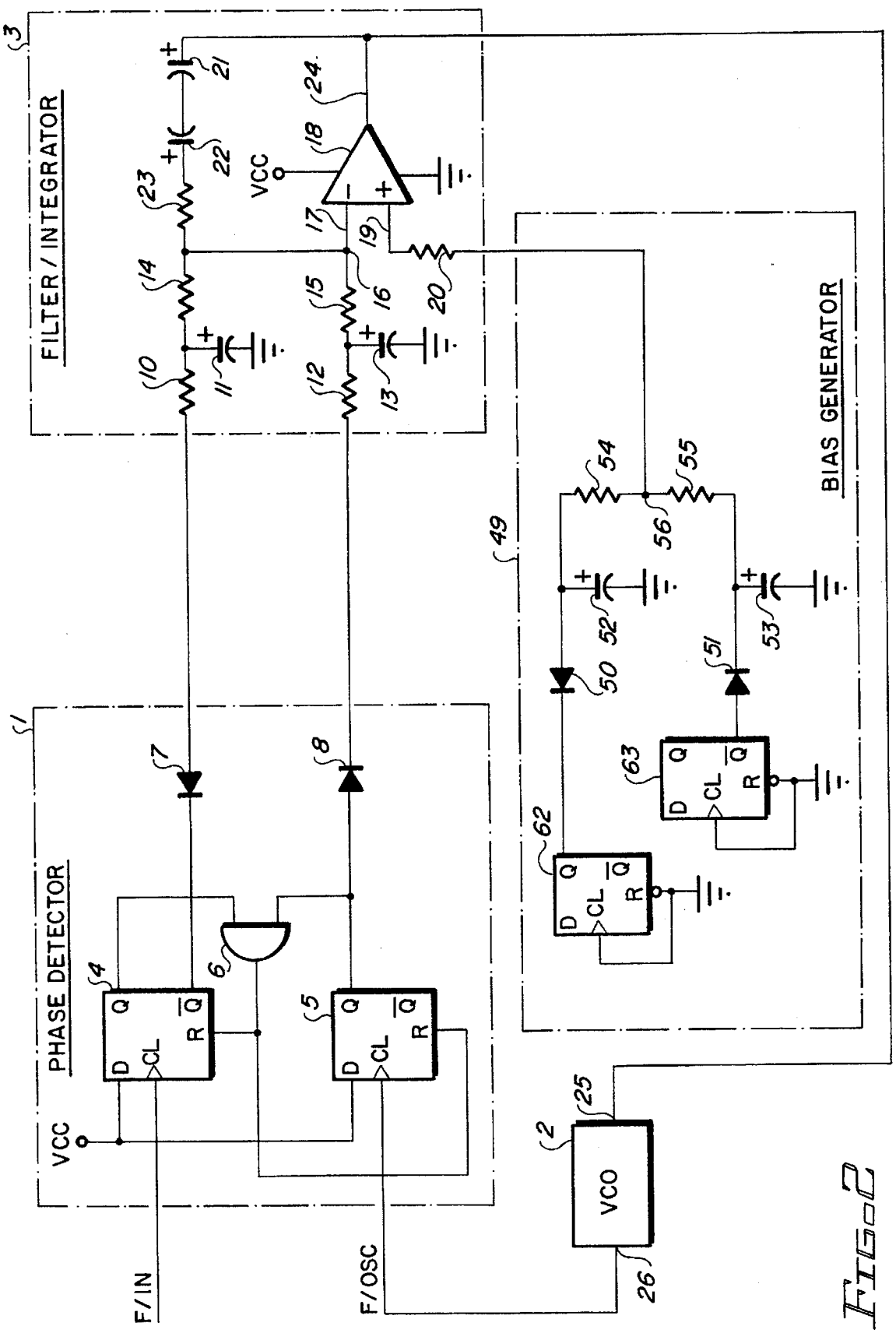
FIG. 2 shows a similar phase locked loop which incorporates a first embodiment of the present invention to obtain improved high frequency performance.

Attention is now directed to FIG. 2 in which there is presented a first embodiment of a compensating circuit which overcomes this subtle source of error according to the invention. In this revised phase locked loop, the positive bias voltage appearing at the reference input 19 to the differential amplifier 18 originates in a bias generator 49 at a summing point 56 disposed at the junction between summing resistors 54, 55. The other end of summing resistor 54 is connected to one terminal of a capacitor 52 (which has its other terminal connected to ground potential) and also to the anode electrode of a diode 50 which has its cathode electrode connected to the Q output of a D-type flip-flop 62. Similarly, the other end of summing resistor 55 is connected to one terminal of a capacitor 53 (which has its other terminal connected to ground potential) and also to the cathode electrode of a diode 51 which has its anode electrode connected to the Q-bar output of a D-type flip-flop 63.

The diodes 50, 51 are closely matched to one another and to the diodes 7, 8 as by selection and/or by the use of diodes all resident on the same integrated circuit (which tend to be inherently well matched). The capacitors 52, 53 and the resistors 54, 55 are also respectively carefully matched. In addition, the flip-flops 62, 63 are matched to the flip-flops 4, 5, respectively, as by use of circuits resident on the same integrated circuit.

The clock and reset inputs to each of the flip-flops 62, 63 are each permanently connected to ground potential such that each of these two flip-flops assumes and stays at the reset state when power is present. Therefore, upon power up, the capacitor 53 will charge, through the diode 51 to the logic "1" voltage level which appears statically at the Q-bar output of the flip-flop 63. Similarly, the capacitor 52 will discharge, through the diode 50 to the logic "0" voltage level which appears at the Q output of the flip-flop 62.

Consequently, the voltage appearing at the summing point 56 is exactly at the midpoint between the logic "1" static level at the Q-bar output of flip-flop 63 and the logic "0" static level at the Q output of flip-flop 62, and, as previously mentioned, this voltage is used as the reference applied to the positive input 19 of the differential amplifier 18. If there is an offset from the ideal voltage which should appear at the summing point 16 due to the slight differences in "pump up" and "pump down" currents during the equal width "pump up" and "pump down" pulses, then the same voltage offset appears at the summing point 36 of the bias generator 29. This offset voltage is, in turn, applied to the positive input 19, through isolation resistor 20, to exactly counteract the offset voltage appearing at the summing point 16.

That is, if, for example, the voltage at the summing point 16, under conditions of true phase lock, is slightly more positive than it should be, the voltage appearing at the positive input 19 to the differential amplifier 18 will also be slightly more positive by the same amount, thus compensating for the error. Since there is no differential error across the inputs 17, 19 to the differential amplifier 18, the voltage appearing at the output 24 of the differential amplifier will be that which is correct to maintain the frequency of the VCO 2 when actual phase lock is reached. As a result, true phase lock may be obtained and maintained.

Figure 3:
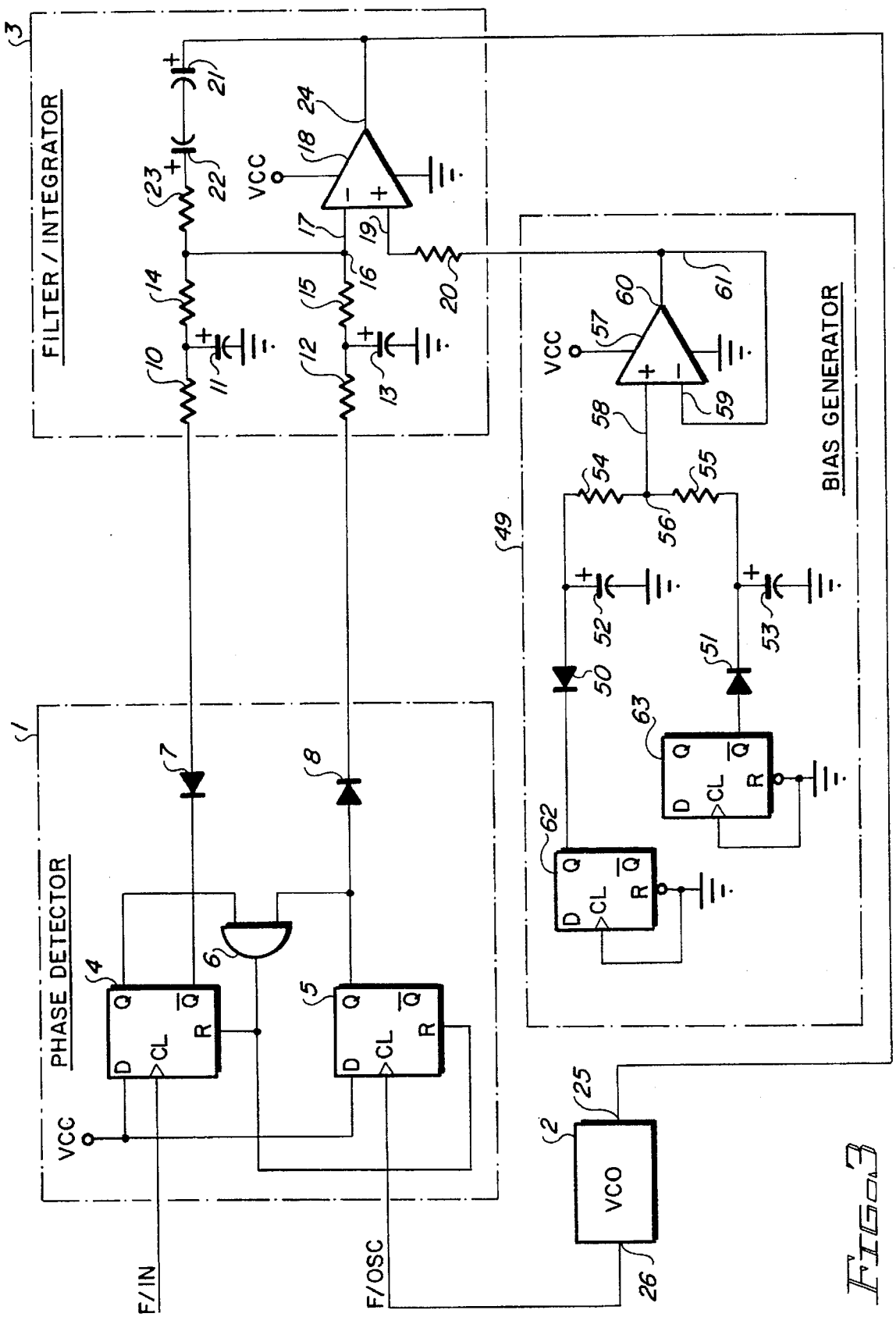
FIG. 3 shows a phase locked loop which incorporates a second embodiment of the present invention.

FIG. 3 illustrates a variant embodiment of the invention shown in FIG. 2 in which a differential amplifier 57 is interposed between the summing point 56 and the positive input 19 to the differential amplifier 18. The differential amplifier 57 is connected for unity gain between its output 60 and its negative input 59 by feedback loop 61. Thus, the voltage appearing at the summing point 56, applied to the positive input 58 of the differential amplifier 57 is also present at the differential amplifier output 60. The purpose of the differential amplifier 57 in this embodiment of the invention is to isolate the summing point 56 from any substantive current drain through the positive input 19. However, inasmuch as the input impedance to the positive input 19 of the differential amplifier 18 is high, the differential amplifier 57 is not necessary for most application, and the circuit of FIG. 2 is adequate.

It will be apparent that the accuracy of compensation achieved by the circuits shown in FIGS. 2 and 3 is somewhat dependent on how respectively well matched the flip-flops 4, 5 and the flip-flops 62, 63 are to one another. In practice, it has been found that, although there may be a slight advantage to using flip-flops resident on the same integrated circuit, such is not usually necessary if the flip-flop integrated circuits are the same type, are powered with the same $V_{CC}$ source and are exposed to the same temperature variations. Under these conditions, variations in $V_{CC}$ and/or temperature will affect the flip-flops 4, 5, 62, 63 substantially identically such that any resulting changes in logic "1" and logic "0" voltage levels are precisely compensated.

Figure 4:
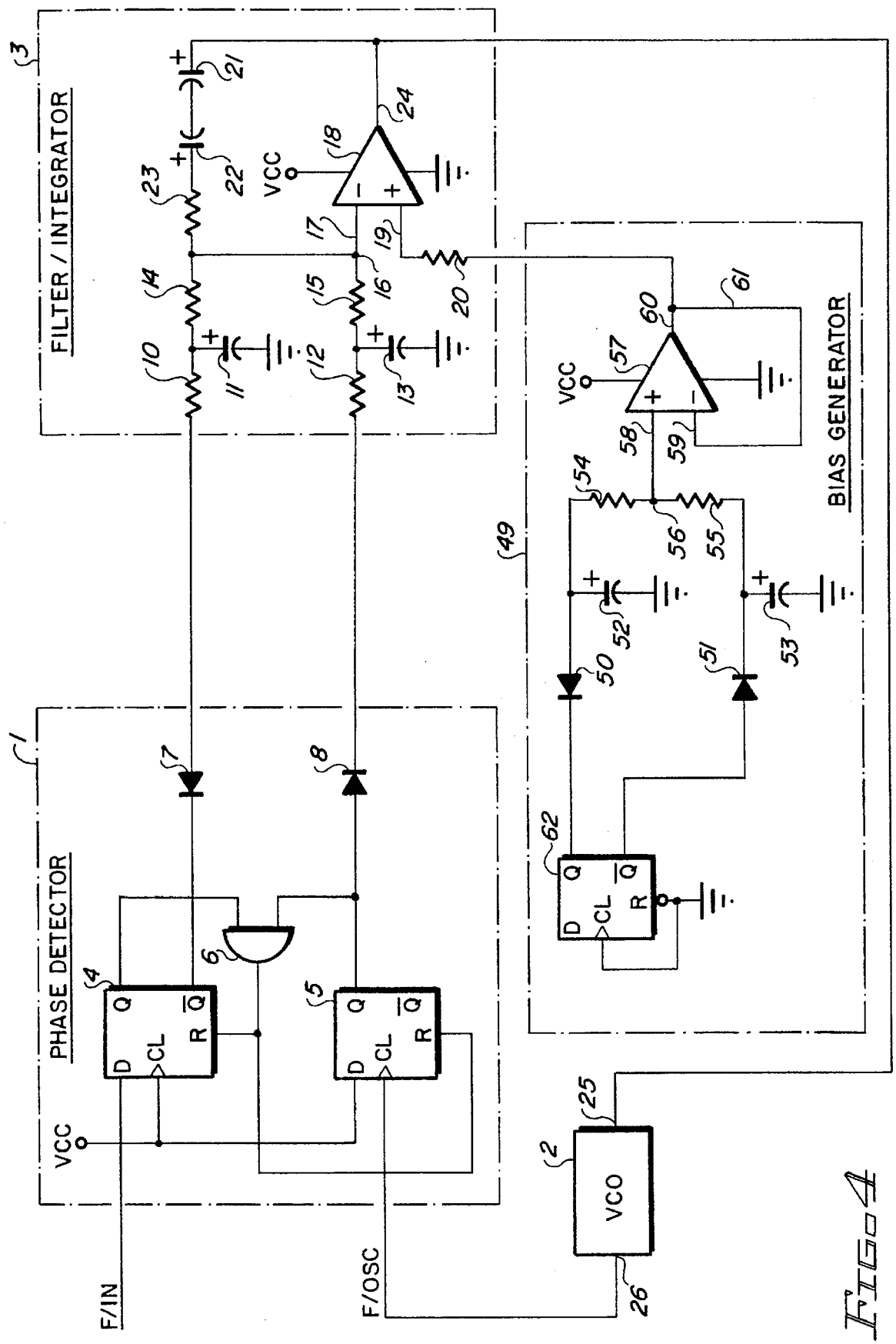
FIG. 4 shows a phase locked loop which incorporates a third embodiment of the present invention.

A further simplification to the compensating circuit may be used as shown in FIG. 4 for less critical applications. The only difference between this circuit and that shown in FIG. 3 is that the flip-flop 62 serves as the source of both the reference logic "1" and logic "0" voltage levels which are summed at the summing point 56. Thus, the Q output of the flip-flop 62 is connected to the cathode electrode of the diode 50 to supply the logic "0" reference sample, and the Q-bar output is connected to the anode electrode of the diode 51 to supply the logic "1" reference sample.

In the foregoing description, certain simplifications have been made to more clearly set forth the invention. For example, positive logic has been assumed throughout. Those skilled in the art will be able to readily adapt the principles of the invention to any application using any given logic family by is following the teachings of the present specification taken with the accompanying drawing.

Thus, while the principles of the invention have now been made clear in illustrative embodiments, them will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. In a phase locked loop including:
   A) a phase detector circuit comprising:
      1) first and second flip-flops capable of assuming first and second alternative binary states, each of said first and second flip-flops having a clock input, a reset input and at least one output issuing an output signal at one of logic "1" and logic "0" voltage levels depending upon a present state of said flip-flop, each of said first and second flip-flops:
         a) being connected to switch to said first state by a transition of a clock signal applied to said clock input thereof; and
         b) having a reset input which is responsive to a transition of a clear signal to switch said flip-flop to said second state;
      2) a clear signal generator responsive to the condition in which both said first and second flip-flops are simultaneously in said first state to issue said clear signal;
   B) a reference frequency signal applied to said clock input of said first flip-flop;
   C) a filter/integrator/amplifier circuit comprising:
      1) a first capacitor having first and second terminals;
      2) a first diode coupled between said first terminal of said first capacitor and said output of said first flip-flop, said first diode being polarized to pass current only when said first flip-flop is in a predetermined one of said first and second states;
      3) a second capacitor having first and second terminals;
      4) a second diode coupled between said first terminal of said second capacitor and said output of said second flip-flop, said second diode being polarized to pass current only when said second flip-flop is in the alternative state to the state of said first flip-flop which allows said first diode to pass current;
      5) said second terminal of each of said first and second capacitors being connected to the same voltage reference level;
      6) a control amplifier having first and second inputs and an output, the voltage appearing at said output being dependent upon the difference between the voltages applied to said first and second inputs;
      7) a first summing resistor connected between said first team of said first capacitor and said first input of said control amplifier;
      8) a second summing resistor connected between said first terminal of said second capacitor and said first input of said control amplifier; and
      9) control amplifier biasing means for supplying a reference bias voltage to said second input of said control amplifier; and
   D) a voltage controlled oscillator having a control input and an output, said control input being connected to said output of said control amplifier such that the frequency of oscillation of said voltage controlled oscillator is dependent on the voltage appearing at the output of said control amplifier, said output of said voltage controlled oscillator being coupled to said clock input of said second flip-flop;

the improvement in which said phase locked loop further includes a phase a offset correction circuit including:

E) third and fourth flip-flops, each of said third and fourth flip-flops having at least one output issuing an output signal at one of logic "1" and logic "0" voltage levels depending upon a present state of said flip-flop; and F) means forcing said third and fourth flip-flops to assume and maintain a predetermined state;

said phase offset correction circuit being adapted to:

G) sample one of said logic "1" and logic "0" voltage levels at said output of said third flip-flop;

H) sample at said output of said fourth flip-flop the voltage level not sampled at said output of said third flip-flop;

I) algebraically avenge said sampled logic "1" and logic "0" voltage levels to develop a midpoint voltage; and J) couple said midpoint voltage to said second input of said control amplifier as said reference bias voltage.

2. The phase locked loop of claim 1 in which said phase offset correction circuit comprises:

A) a third capacitor having first and second terminals;

B) a third diode coupled between said first terminal of said third capacitor and said output of said third flip-flop, said third diode being polarized to pass current;

C) a fourth capacitor having first and second terminals;

D) a fourth diode coupled between said first terminal of said fourth capacitor and said output of said fourth flip-flop, said fourth diode being polarized to pass current;

E) said second terminal of each of said third and fourth capacitors being connected to the same voltage reference level as said second terminal of each of said first and second capacitors;

F) a third summing resistor connected between said first terminal of said third capacitor and an averaging point;

G) a fourth summing resistor connected between said first terminal of said fourth capacitor and said averaging point; and H) means coupling the voltage appearing at said averaging point to said second input of said control amplifier as said reference bias voltage.

3. The phase locked loop of claim 2 in which said third and fourth summing resistors have the same resistance values.

4. The phase locked loop of claim 1 in which said phase offset correction circuit includes a gain-of-one isolation amplifier having an input connected to receive said midpoint voltage and an output coupled to said second input of said control amplifier.

5. The phase locked loop of claim 2 in which said means coupling the voltage appearing at said averaging point to said second input of said control amplifier as said reference bias voltage comprises a gain-of-one isolation amplifier.

6. The phase locked loop of claim 3 in which said means coupling the voltage appearing at said averaging point to said second input of said control amplifier as said reference bias voltage comprises a gain-of-one isolation amplifier.

7. A phase locked loop including:

A) a phase detector circuit comprising:

1) first and second flip-flops capable of assuming first and second alternative binary states, each of said first and second flip-flops having a clock input, a reset input and at least one output issuing an output signal at one of logic "1" and logic "0" voltage levels depending upon a present state of said flip-flop, each of said first and second flip-flops:

a) being connected to switch to said first state by a transition of a clock signal applied to said clock input thereof; and b) having a reset input which is responsive to a transition of a clear signal to switch said flip-flop to said second state;

2) a clear signal generator responsive to the condition in which both said first and second flip-flops are simultaneously in said first state to issue said clear signal;

B) a reference frequency signal applied to said clock input of said first flip-flop;

C) a filter/integrator/amplifier circuit comprising:

1) a first capacitor having first and second terminals;

2) a first filter resistor having one end connected to said first terminal of said first capacitor;

3) a first diode coupled between a second end of said first filter resistor and said output of said first flip-flop, said first diode being polarized to pass current only when said first flip-flop is in a predetermined one of said first and second states;

4) a second capacitor having first and second terminals;

5) a second filter resistor having one end connected to said first terminal of said second capacitor;

6) a second diode coupled between a second end of said second filter resistor and said output of said second flip-flop, said second diode being polarized to pass current only when said second flip-flop is in the alternative state to the state of said first flip-flop which allows said first diode to pass current;

7) said second terminal of each of said first and second capacitors being connected to the same voltage reference level;

8) a control amplifier having first and second inputs and an output, the voltage appearing at said output being dependent upon the difference between the voltages applied to said first and second inputs;

9) a first summing resistor connected between said first terminal of said first capacitor and said first input of said control amplifier; and 10) a second summing resistor connected between said first terminal of said second capacitor and said first input of said control amplifier;

D) a voltage controlled oscillator having a control input and an output, said control input being connected to said output of said control amplifier such that the frequency of oscillation of said voltage controlled oscillator is dependent on the voltage appearing at the output of said control amplifier, said output of said voltage controlled oscillator being coupled to said clock input of said second flip-flop; and E) a phase offset correction circuit comprising:

1) third and fourth flip-flops, each of said third and fourth flip-flops having at least one output issuing an output signal at one of logic "1" and logic "0" voltage levels depending upon a present state of said flip-flop;

2) means forcing said third and fourth flip-flops to assume and maintain a predetermined state;

3) a third capacitor having first and second terminals;

4) a third filter resistor having one end connected to said first terminal of said third capacitor;

5) a third diode coupled between a second end of said third filter resistor and said output of said third flip-flop, said third diode being polarized to pass currents;

6) a fourth capacitor having first and second terminals;
7) a fourth filter resistor having one end connected to said first terminal of said fourth capacitor;
8) a fourth diode coupled between a second end of said fourth filter resistor and said output of said fourth flip-flop, said fourth diode being polarized to pass current;
9) said second terminal of each of said third and fourth capacitors being connected to the same voltage reference level as said second terminal of each of said first and second capacitors;
10) a third summing resistor connected between said first terminal of said third capacitor and an averaging point;
11) a fourth summing resistor connected between said first terminal of said fourth capacitor and said averaging point, said fourth summing resistor having a resistance equal to that of said third summing resistor; and
12) means coupling the voltage appearing at said averaging point to said second input of said control amplifier to provide a reference bias voltage thereto.

8. The phase locked loop of claim 7 in which said means coupling the voltage appearing at said averaging point to said second input of said control amplifier as said reference bias voltage comprises a gain-of-one isolation amplifier.

9. A phase locked loop including:
A) a phase detector circuit comprising:
1) first and second flip-flops capable of assuming first and second alternative binary states, each of said first and second flip-flops having a clock input, a reset input and at least one output issuing an output signal at one of logic "1" and logic "0" voltage levels depending upon a present state of said flip-flop, each of said first and second flip-flops:
   a) being connected to switch to said first state by a transition of a clock signal applied to said clock input thereof; and
   b) having a reset input which is responsive to a transition of a clear signal to switch said flip-flop to said second state;
2) a clear signal generator responsive to the condition in which both said first and second flip-flops are simultaneously in said first state to issue said clear signal;
B) a reference frequency signal applied to said clock input of said first flip-flop;
C) a filter/integrator/amplifier circuit comprising:
1) a first capacitor having first and second terminals;
2) a first filter resistor having one end connected to said first terminal of said first capacitor;
3) a first diode coupled between a second end of said first filter resistor and said output of said first flip-flop, said first diode being polarized to pass current only when said first flip-flop is in a predetermined one of said first and second states;
4) a second capacitor having first and second terminals;
5) a second filter resistor having one end connected to said first terminal of said second capacitor;
6) a second diode coupled between a second end of said second filter resistor and said output of said second flip-flop, said second diode being polarized to pass current only when said second flip-flop is in the alternative state to the state of said first flip-flop which allows said first diode to pass current;
7) said second terminal of each of said first and second capacitors being connected to the same voltage reference level;
8) a control amplifier having first and second inputs and an output, the voltage appearing at said output being dependent upon the difference between the voltages applied to said first and second inputs;
9) a first summing resistor connected between said first terminal of said first capacitor and said first input of said control amplifier; and
10) a second summing resistor connected between said first terminal of said second capacitor and said first input of said control amplifier;

D) a voltage controlled oscillator having a control input and an output, said control input being connected to said output of said control amplifier such that the frequency of oscillation of said voltage controlled oscillator is dependent on the voltage appearing at the output of said control amplifier, said output of said voltage controlled oscillator being coupled to said clock input of said second flip-flop; and E) a phase offset correction circuit comprising:
1) a third flip-flop having first and second outputs, each issuing an output signal at one of logic "1" and logic "0" voltage levels depending upon a present state of said third flip-flop;
2) means forcing said third flip-flop to assume and maintain a
3) a third capacitor having first and second terminals;
4) a third filter resistor having one end connected to said first terminal of said third capacitor;
5) a third diode coupled between a second end of said third filter resistor and said first output of said third flip-flop, said third diode being polarized to pass currents;
6) a fourth capacitor having first and second terminals;
7) a fourth filter resistor having one end connected to said first terminal of said fourth capacitor;
8) a fourth diode coupled between a second end of said fourth filter resistor and said second output of said third flip-flop, said fourth diode being polarized to pass current;
9) said second terminal of each of said third and fourth capacitors being connected to the same voltage reference level as said second terminal of each of said first and second capacitors;
10) a third summing resistor connected between said first terminal of said third capacitor and an averaging point;
11) a fourth summing resistor connected between said first terminal of said fourth capacitor and said averaging point, said fourth summing resistor having a resistance equal to that of said third summing resistor; and
12) means coupling the voltage appearing at said averaging point to said second input of said control amplifier to provide a reference bias voltage thereto.

10. The phase locked loop of claim 9 in which said means coupling the voltage appearing at said averaging point to said second input of said control amplifier as said reference bias voltage comprises a gain-of-one isolation amplifier.

* * * * *